United States Patent [19]

Diepers

[11] Patent Number: 4,461,689

[45] Date of Patent: Jul. 24, 1984

[54] METHOD AND APPARATUS FOR COATING A GRAPHITE MEMBER

[75] Inventor: Heinrich Diepers, Höchstadt, Fed. Rep. of Germany

[73] Assignee: Siemens Aktiengesellschaft, Munich, Fed. Rep. of Germany

[21] Appl. No.: 917,383

[22] Filed: Jun. 20, 1978

[30] Foreign Application Priority Data

Jun. 20, 1977 [DE] Fed. Rep. of Germany ....... 2727683
Dec. 22, 1977 [DE] Fed. Rep. of Germany ....... 2757374

[51] Int. Cl.³ .................... C23C 15/00; H01R 39/20
[52] U.S. Cl. .................... 204/192 N; 310/253; 427/39; 427/114
[58] Field of Search ............... 204/192 N; 310/248, 310/249, 253; 427/113, 114, 38, 39

[56] References Cited

U.S. PATENT DOCUMENTS

| 3,433,682 | 3/1969 | Kalnin | 427/250 |
| 3,547,692 | 12/1970 | Hill | 427/114 |
| 3,860,443 | 1/1975 | Lachman et al. | 427/113 |
| 4,016,389 | 4/1977 | White | 219/10.49 |
| 4,132,828 | 1/1979 | Nakamura | 428/366 |

FOREIGN PATENT DOCUMENTS

2658234 12/1976 Fed. Rep. of Germany ...... 427/114

OTHER PUBLICATIONS

D. M. Mattox, Fundamentals of Ion Plating, J. Vac. Sci. Technol., vol. 10, No. 1, Jan./Feb. 1973, pp. 47–52.
S. Schiller et al., Alternate Ion Plating–A Method of High-Rate Ion Vapor Deposition, J. Vac. Sci. Technol., vol. 12, No. 4, Jul./Aug. 1975, pp. 858–864.
R. D. Blond et al., Effect of Ion Bombardment during Deposition on Thick Metal and Ceramic Deposits, J. Vac. Sci. Technol., vol. 11, No. 4, Jul./Aug. 1974, pp. 621–674.
R. Carpenter, Ion Plating: How to Make Films Stick, Compon. Technol., vol. 4, No. 6, Feb. 1971, pp. 17–22.

*Primary Examiner*—G. L. Kaplan
*Assistant Examiner*—William T. Leader
*Attorney, Agent, or Firm*—Kenyon & Kenyon

[57] ABSTRACT

A method and apparatus for coating a member of graphite with a thin layer of an electrically highly conductive material from the vapor phase in which at least part of the material is deposited on the graphite member by ion plating to result in particularly well adhering and relatively thick layers of the materials being deposited on the graphite members.

6 Claims, 1 Drawing Figure

U.S. Patent                Jul. 24, 1984                4,461,689
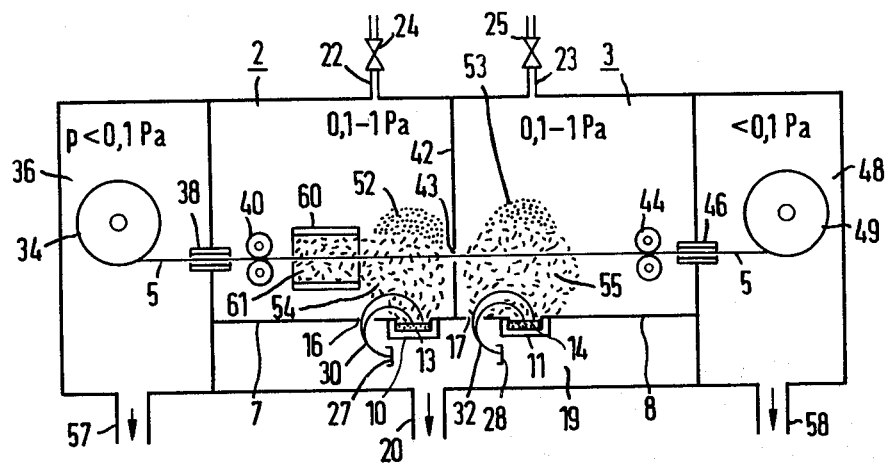

METHOD AND APPARATUS FOR COATING A GRAPHITE MEMBER

BACKGROUND OF THE INVENTION

This invention relates to the coating of members of graphite with a thin layer of an electrically highly conductive material from the vapor phase in general and more particularly to such a method using ion plating.

Graphite members to be coated are generally long carbon filaments or fibers, which may be combined in bundles. In a method, known from U.S. Pat. No. 3,550,247, for coating carbon filaments, the latter are first exposed to an aqueous oxidant and subsequently placed in a reaction solution which contains the material to be deposited, i.e., a metal. In a reduction reaction, the metal is then deposited on the pre-treated surfaces of the carbon filaments. Such fibers provided with a metal coating are required for assembling fiber contact brushes which are used for transmitting current between a stationary and a rotating part of an electric machine, for instance, a unipolar machine. With the known method, however, the danger exists that the individual fibers can stick together during the coating process and thus, only a non-uniform coating is obtained.

This danger, which exists particularly with very thin individual fibers, can also not be precluded completely by the method known from the British Pat. No. 1,309,252, although, in that method, the fiber bundle is conducted, prior to the coating process proper, through a chamber which is flared out in the direction of motion of the bundle and is exposed in the process to several jets of liquid arranged in series. Since the number of liquid jets, which are directed at right angles to the direction in which the bundle is led, steadily increases in the direction of motion of the bundle, the fibers are spread apart accordingly. This method, however, is relatively complicated and assumes that the fibers in the fiber bundle are not twisted.

With these methods of electroless deposition or electro deposition, only a very limited number of metals can furthermore be applied to the fibers. In addition, difficulties come up with this method in achieving satisfactory adhesion and high conductivity.

Furthermore, materials can also be deposited on graphite members by cathode sputtering ("Vakuumtechnik", 1975, pages 1 to 11). With such a method, a gas discharge process in a plasma is brought about between two electrodes. In the electric field required therefor, the gas ions are accelerated in a direction toward a cathode. When they arrive at the cathode surface with an energy of up to several keV, they release, on the one hand, secondary electrons which are necessary to maintain the gas discharge process, and, on the other hand, they knock out cathode material by means of collision processes. The usually electrically neutral particles of cathode material so produced diffuse through the gas and hit the member to be coated, which constitutes the anode, with average energies of several eV. These particles, however, can generally be precipitated only in a very thin layer, as the attainable condensation rate is relatively low as compared to pure vapor deposition and is, for instance, 100 times lower than with vapor deposition.

Particularly strict requirements apply to graphite containing members such as, for instance, fiber bundles which are to be used as brushes in electric machines. These requirements are, in particular, that electrically highly conductive materials, e.g., copper or silver, with nearly the conductivity of the solid material, must be applied in a relatively thin layer. In addition, good adhesion between the different materials is to be achieved. This is difficult, however, with metals such as copper, silver or gold which are not carbide forming. In addition, it should be possible to avoid corrosion phenomena of the applied layer materials. Optionally, the possibility of corrosion protection must therefore be provided. Furthermore, the friction along the individual graphite members should be small also if the graphite members are densely packed within a bundle, as the individual graphite member in such a bundle must be considered as an elastically suspended contact point which should follow the surface profile of the rotating machine part as exactly as possible.

SUMMARY OF THE INVENTION

Starting out from the known method for depositing evaporated materials on graphite members, it is an object of the present invention to provide a method, in which the mentioned requirements as to the graphite members, which are to be provided particularly for brush contacts in rotating machines, are met.

For a method of the kind mentioned at the outset, this problem is solved, according to the present invention, by precipitating at least part of the material on the graphite member by ion plating.

Ion plating is understood here to mean an evaporation process, in which the atoms or molecules to be deposited are partly ionized in a plasma and arrive in an electric field with higher energy at the graphite member to be coated ("Vakuumtechnik" 1976, pages 65 to 72 and pages 113 to 120). Felts or mats of short graphite fibers or bundles of long graphite fibers or graphite foil can advantageously be provided as members to be coated, which are suitable particularly for brush contacts.

As compared to the known evaporation or cathode sputtering technology, the method according to the present invention has substantial advantages which consist particularly in improved adhesion of the deposited material and relatively high growth rates of up to several micrometers per minute. With the method, the graphite material of the member to be coated can first be cleaned with a cold evaporation source, i.e., for instance only by means of an argon plasma, by ion bombardment, i.e., subjected to an etching treatment, and the transition to the ion plating process can be made, increasing in intensity, still during this cleaning process until the vapor deposition rate of the former exceeds the etching rate of the cleaning process in a desired manner. Thus, adjustable concentration gradients in the boundary layer between the graphite material and the substance material are obtained and in this manner, materials that can be joined only with difficulty or not at all can be made to adhere to the graphite base material. Further, an etching rate which has a beneficial effect on the purity of the graphite material and of the substance material deposited on it, which is largely independent of the magnitude of the vapor deposition or plating rate is always provided.

It is furthermore possible only by means of ion plating that, for producing well adhering layers, first, a boundary layer of the substance material is formed, then the formation of the gas discharge plasma required therefor is stopped while the vapor deposition of the substance material on the graphite member continues, and subsequently, the remainder of the layer of substance material is applied by vapor deposition alone. This process cycle leads to particularly pure layers and can be employed to advantage especially where the plasma is not desired and therefore, only short burning periods can be allowed, as, for instance, with temperature sensitive graphite members. In addition, particularly if fiber structures are used as the graphite member, uniform coverage of the individual fibers of these fiber structures is obtained, since, in ion plating, the attraction of the fibers, which are at negative potential, along the field lines is added to the scattering of the vapor particles from the substance material at the working gas.

If layers of insulating materials are also to be ion plated on the already coated graphite member, it can be advantageous to apply a high-frequency voltage to the graphite member.

For implementing the method according to the present invention, apparatus which contains at least one coating chamber as well as means for conducting the graphite member to be coated through the interior of the former, and means for evaporating the material, and in which a gas discharge plasma is developed between the graphite member and the substance, is particularly well suited.

This apparatus can advantageously contain two coating chambers arranged in tandem, to permit the graphite members passed through them to also be continuously post coated. By means of the post coating operation, a corrosion layer, for instance, can be applied on the graphite member which is already coated with the material.

BRIEF DESCRIPTION OF THE DRAWING

The single FIGURE illustrates apparatus for ion plating an elongated graphite body.

DETAILED DESCRIPTION OF THE INVENTION

The graphite member to be coated can be, in particular, a graphite felt, i.e., a felt like fabric of short graphite fibers in which the fibers are oriented randomly and irregularly, or a graphite mat, i.e., a layer, only paper thin, also of short graphite fibers, or a graphite foil which can be made by thermal decomposition of graphite embeddment compounds and pressing the graphite flakes produced. In all cases, the material is highly graphitized.

With the apparatus shown in the FIGURE, graphite fibers several micrometers thick, of which several thousand are combined in a bundle, in particular, can also be coated with electrically highly conductive and well adhering layers, for instance, of copper, nickel, cobalt, silver or gold, by means of ion plating. The thickness of these layers is very small and is, for instance, about 1 μm. However, thicker layers can also be applied.

The apparatus contains two coating chambers 2 and 3 arranged next to each other for the main coating and post coating of such a graphite fiber bundle 5. In its bottom part, 7 and 8, respectively, each coating chamber is equipped with a crucible, 10 and 11, in which a substance material, 13 and 14, respectively, to be deposited on the fibers of the fiber bundle 5, is arranged. In each of the two bottom parts is further provided an opening, 16 and 17, respectively. The interior of the two coating chambers 2 and 3 are connected via these openings to a vacuum chamber 19 and are evacuated from there. Vacuum chamber 19 can be evacuated, via a pump connection 20, to a residual gas pressure of, say, less than 0.1 Pa(0.1 N/m²). To the interiors of the coating chambers 2 and 3, respectively, an inert gas can be admitted at a gas inlet 22 or 23; this gas is also called the plasma gas or working gas, which may, for instance, be argon. The gas flow of the admitted gas through the coating chambers is regulated in such a manner, by the respective inlet valves 24 and 25, that a predetermined operating pressure of, say, 0.1 Pa to 1 Pa adjusts itself. This operating pressure can be kept constant dynamically, i.e., enough gas is fed in at the inlet valves 24 and 25 that the desired operating pressure adjusts itself when the interiors of the two coating chambers are pumped out, at the same time, at the openings 16 and 17.

For evaporating the substance materials 13 and 14, two so called electron beam evaporators are provided. For this purpose, two electron beam sources 27 and 28 are arranged in the vacuum chamber 19. The electron beam 30 generated by the electron beam source 27 is deflected 270° and is directed so that it enters through the opening 16 in the bottom part 7 and strikes the material 13 in the crucible 10. The material 13 is then evaporated and the stream of vapor is partially ionized. Similarly, the electron beam 32 generated by the electron beam source 28 passes through the opening 17 in the bottom part 8 and evaporates the material 14, simultaneously partially ionizing the vapor.

The carbon fiber bundle 5 is now pulled through the two coating chambers 2 and 3. The fiber bundle, which can be twisted in the process, is unwound from a reel 34 which is arranged in a side chamber 36 which is adjacent to the coating chamber 2 and can be evacuated, and is pulled through a tubular aperture 38 of insulating material in the partition between the two chambers 2 and 36 into the coating chamber 2. For conducting the fiber bundle 5, two guide pulleys 40 are provided in this coating chamber. The fiber bundle 5 then passes from the first coating chamber 2 into the second coating chamber 3 through an opening 43 arranged in their common partition 42. After the fiber bundle is pulled through this coating chamber, in which further guide pulleys 44 are provided for guidance, it is pulled through a tubular aperture 46 of insulating material into a side chamber 48 which is adjacent to the coating chamber 3 and can be evacuated, and where it is wound on a reel 49.

In order that the materials 13 and 14 can be applied on the fiber bundle 5 by means of ion plating in the two coating chambers 2 and 3, the fiber bundle must be brought to a potential of several kV, for instance 5 kV, negative with respect to the walls of the coating chambers and therefore, to the crucibles 10 and 11 containing the materials. The chambers are advantageously at ground potential. Therefore, a gas discharge plasma can be ignited between the fiber bundle 5 and the components in its vicinity which are ground potential, i.e., preferably in the vapor jets 52 and 53, between the fiber bundle 5 on the one hand and the vapor source in the crucibles 10 and 12, respectively, on the other hand. The plasma is designated with 54 and 55, respectively. The plasma serves, in addition to the electron beams 30 and 32, respectively, primarily as an ionization source for the evaporated material 13 and 14. This ionized, vaporous material is accelerated, along with the ionized atoms of the working gas, toward the fiber bundle and is therefore shot against the surfaces of the individual fibers. Thereby, good adhesion is obtained in the boundary layer between the fiber material and the deposited material.

Neutral atoms of the working gas or atoms of the vapor deposition material, which were accelerated by collisions with ions or were previously accelerated as ions and became neutral through charge exchange, act in the same manner.

The negative high voltage can be applied to the fiber bundle 5, for instance, via the guide pulleys 40 or 44.

In order to prevent plasma in the side chambers 36 and 48 from also being ignited, the vacuum prevailing in these chambers must be lower than that in the coating chambers 2 and 3. The chambers 36 and 48 must therefore be evacuated via their respective pump connections 57 and 58, for instance, to a pressure less than 0.1 Pa.

Before the carbon fiber bundle 5 gets into the region of the first plasma within the first coating chamber 2, it is advantageously conducted through a tubular etching device 60. This etching device has a negative bias relative to the parts of the coating chamber which are at ground potential. This bias is smaller, however, than the high voltage applied to the fiber bundle 5 and is, for instance, minus some hundreds of volts. Thus, the fiber bundle 5 is also biased negatively relative to the etching device 60. Therefore, the carbon fiber bundle can first be cleaned in the etching device by a cathode-ray etching process, which is also called sputter etching. The energy required therefor can be supplied to the etching device 60 by a generator, not shown in the FIGURE, via a feed line. The etching rate can be set by the magnitude of the negative bias. Due to the negative bias of the fiber bundle 4 relative to the etching device 60, sputtering of the fiber material only at its surfaces takes place in the plasma ignited in the etching device. Better adhesion of the substance material to be deposited at the fiber surfaces is obtained thereby. Behind this etching device, the fiber material reaches the first plasma zone 54 of the main coating arrangement, where it is coated, for instance, with copper. After traversing this plasma zone, it reaches the second plasma zone 55 in the second coating chamber 3, where it can be post coated with the material 14. This post coating can serve, for instance, for corrosion protection and can be performed with cobalt, nickel or niobium selenide, $NbSe_2$.

Instead of the coating method described, in which two ion plating steps follow an etching process, one of these plating steps, especially the second one, can be replaced by a simple vapor deposition step without the aid of a plasma. If, for instance, a carrier layer is first to be vapor deposited, immediately following the etching process without the aid of a plasma, then a partition between the etching device and the vapor deposition zone would have to be provided in the first coating chamber.

It has further been found that it is advantageous, for increasing the purity of the layers of material applied to the fibers of the fiber bundle, to use molecular turbo pumps instead of throttled diffusion pumps for evacuating especially the coating chamber 2 and 3 via the vacuum chamber 19, since molecular turbo pumps still work with full evacuating efficiency even at residual gas pressures above 1 Pa and can therefore maintain a low residual gas pressure. It may therefore be of advantage to connect a molecular turbo pump, not shown in the FIGURE, directly to the coating chambers 2 and/or 3.

When low melting point metals are used as coating materials, simple thermal evaporation sources can also be provided instead of the electron beam evaporators indicated in the FIGURE. Then, evaporating the substance material by means of an electron beam can be eliminated. Similarly, the partitions 7 and 8 can then be omitted.

Besides the method for depositing substance materials by means of ion plating explained with the aid of the FIGURE, the so-called plasma plating method can also be used. In this process variation of ion plating, one starts out with a special design of a so-called magnetron as the evaporation source. While, in the generally used magnetrons, electrons are deflected in a magnetic field disposed between a cathode and an anode, a plasma is provided in this special design. This design is therefore also called a plasmatron. In general, it contains a crucible which, like the graphite fiber bundle itself, is biased negatively. A positively biased ring surrounding the crucible serves as the anode. Between this anode and the crucible, a plasma which serves for atomizing the material arranged in the crucible then burns and thus corresponds to the evaporation source for the ion plating process explained with the aid of the FIGURE. The atoms of the coating material sputtered off in this manner are partially ionized on the way to the graphite fiber bundle. By suitably dividing the plasma power between the graphite fiber bundle on the one hand and the crucible, on the other hand, the rates and the percentage of ionized atoms can be influenced. The magnetic field which is provided for the plasmatron and is constant in time but greatly differs in strength spatially, serves to increase the discharge density and therefore, to increase the sputtering rate of the coating material by a factor 100 over a simple ion plating apparatus.

In the apparatus according to the FIGURE, it is assumed that the relatively long graphite fibers of a fiber bundle in it, are to be coated with a material of relatively high electric conductivity. However, felts of relatively short graphite fibers can be coated with this apparatus equally well. The thickness of these felts can be, for instance, a few tenths of a millimeter. Thicker felts can be coated in the apparatus by passing it through twice, plating once from the front and the second time from the back. Thus, for instance, in a double pass, all individual fibers of a felt having a thickness of about 1.5 mm can be coated uniformly.

Besides the coating of graphite fiber felts or graphite fiber bundles mentioned, graphite fiber mats or graphite foil can also be coated equally well with the apparatus according to the present invention.

Several of these coated graphite members can subsequently be combined in a bundle which is intended for sliding brush contacts in electric machines.

What is claimed is:

1. In a method of coating felts or mats of short graphite fibers for brushes in electric machines with thin layers of electrically highly conductive coating material from the vapor phase, the improvement comprising continuously pulling said felts or mats through etching and coating apparatus wherein said felts or mats are coated by steps comprising:
   (a) first subjecting the felts or mats to an etching treatment prior to the coating process by subjecting the felts or mats to a bombardment with ions of an inert gas;
   (b) then, without interruption, preparing a boundary layer of the coating material on the graphite member by ion plating, said ion plating comprising vapor deposition in the presence of a gas discharge plasma;

(c) then stopping the development of the gas discharge plasma, required for ion plating, which continuing the vapor deposition of the same coating material on the felts or mats; and (d) subsequently applying a remaining layer of the same coating material by vapor deposition in a high vacuum alone.

2. The method according to claim 1 wherein one of the group consisting of copper, nickel, cobalt, silver and gold is used as the coating material.

3. The method according to claim 1 wherein a high frequency voltage is applied to the graphite member.

4. The method according to claim 1 and further including applying a further layer of a second coating material over the layer of a first coating material deposited on the graphite member.

5. The method according to claim 4, wherein said second layer comprises a layer selected from the group consisting of cobalt, nickel and niobium selenide applied as corrosion protection.

6. The method according to claim 1, wherein at least part of said coating process comprises depositing on the graphite member at least in part by plasma plating.

* * * * *